(12) United States Patent
Holder et al.

(10) Patent No.: US 7,497,907 B2
(45) Date of Patent: Mar. 3, 2009

(54) PARTIALLY DEVITRIFIED CRUCIBLE

(75) Inventors: John D. Holder, Knoxville, TN (US); Richard J. Phillips, St. Charles, MO (US)

(73) Assignee: MEMC Electronic Materials, Inc., St. Peters, MO (US)

(*) Notice: Subject to any disclaimer, the term of this patent is extended or adjusted under 35 U.S.C. 154(b) by 256 days.

(21) Appl. No.: 10/898,148

(22) Filed: Jul. 23, 2004

(65) Prior Publication Data
US 2006/0016389 A1    Jan. 26, 2006

(51) Int. Cl.
*C30B 35/00*    (2006.01)

(52) U.S. Cl. .................. 117/200; 117/206; 117/213

(58) Field of Classification Search ............. 117/200, 117/206, 213
See application file for complete search history.

(56) References Cited

U.S. PATENT DOCUMENTS

| | | | |
|---|---|---|---|
| 4,218,418 A | 8/1980 | Schmid et al. | |
| 4,256,530 A | 3/1981 | Schmid et al. | |
| 5,053,359 A | 10/1991 | Loxley et al. | |
| 5,389,582 A | 2/1995 | Loxley et al. | |
| 5,720,809 A | 2/1998 | Iino et al. | |
| 5,919,306 A | 7/1999 | Takemura | |
| 5,976,247 A | 11/1999 | Hansen et al. | |
| 5,980,629 A * | 11/1999 | Hansen et al. | 117/13 |
| 6,106,610 A | 8/2000 | Watanabe et al. | |
| 6,447,601 B1 | 9/2002 | Phillips et al. | |
| 6,479,108 B2 | 11/2002 | Hariharan et al. | |
| 6,524,668 B1 | 2/2003 | Tsuji et al. | |
| 7,178,366 B2 | 2/2007 | Schwertfeger et al. | |
| 7,226,508 B2 | 6/2007 | Korus et al. | |
| 7,299,658 B2 | 11/2007 | Ohama et al. | |
| 7,378,128 B2 | 5/2008 | Rancoule | |
| 7,390,361 B2 | 6/2008 | Iida et al. | |
| 2003/0012899 A1 | 1/2003 | Kemmochi et al. | |
| 2004/0040497 A1 | 3/2004 | Kemmochi et al. | |
| 2008/0078207 A1 | 4/2008 | Tsujimoto et al. | |

(Continued)

FOREIGN PATENT DOCUMENTS

EP    1304399 A1    4/2003

(Continued)

OTHER PUBLICATIONS

Patent Abstracts of Japan. English Abstract and computer translation of JP 10-203893 (1998).*

(Continued)

*Primary Examiner*—Robert M Kunemund
*Assistant Examiner*—Matthew J Song
(74) *Attorney, Agent, or Firm*—Armstrong Teasdale LLP

(57) ABSTRACT

A vitreous crucible for holding semiconductor material during a moncrystalline ingot growing process has a sidewall. Part of the sidewall is coated with a devitrification promoter and part of the sidewall is substantially free from devitrification promoter coating. When the crucible is heated as it would be during an ingot growing process, the devitrification promoter induces crystallization of portions of the sidewall, thereby forming enhanced stiffness sidewall portions. Areas that are substantially free from devitrification promoters remain vitreous and are softened by the heat. These become stress accommodating sidewall portions. Flow of the vitreous material in the stress accommodating sidewall portions relieves stresses that would otherwise build up in the sidewall.

14 Claims, 7 Drawing Sheets

U.S. PATENT DOCUMENTS

2008/0127885 A1 6/2008 Hagi
2008/0141929 A1 6/2008 Kemmochi et al.

FOREIGN PATENT DOCUMENTS

| EP | 1408015 A2 | 4/2004 |
|---|---|---|
| JP | 09-175886 | 7/1997 |
| JP | 10203893 A * | 8/1998 |

OTHER PUBLICATIONS

International Search Report for PCT/US2005/024996 dated Nov. 22, 2005.

* cited by examiner

PARTIALLY DEVITRIFIED CRUCIBLE

FIELD OF INVENTION

The present invention relates generally to crucibles for use in the production of monocrystalline semiconductor ingots and in particular to a crucible having both an enhanced stiffness sidewall portion and a stress accommodating sidewall portion.

BACKGROUND OF THE INVENTION

Monocrystalline semiconductor ingots are commonly grown from molten semiconductor material (e.g., polycrystalline silicon) held in a crucible. In the Czochralski process, for example, a charge of semiconductor material is placed in a crucible and melted by a heater surrounding the crucible. A seed crystal is brought into contact with the upper surface of the melt. The molten semiconductor material solidifies at the crystal/melt interface, joining the lattice started by the seed crystal. As the molten semiconductor material is incorporated into the growing ingot, a crystal puller slowly raises the ingot to keep the crystal/melt interface at the upper surface of the melt. Typically, the crucible is also raised during the process to keep the upper surface of the melt at a substantially constant level despite incorporation of material (from the melt into the ingot. Thus, the seed crystal gradually grows into a monocrystalline ingot, the size, shape and other characteristics of which can be controlled by controlling the pull rate, melt temperature, and other variables affecting crystal growth.

Crucibles used to grow semiconductor ingots are commonly made of an amorphous form of silica known as vitreous silica (i.e., fused quartz). Vitreous silica is favored because of its purity, temperature stability and chemical resistance. One disadvantage associated with vitreous silica crucibles is that they lose structural integrity when subjected to the high temperatures of the crystal growing process. In general, these crucibles soften with increasing temperature and are soft enough to easily flow under an applied stress when the crucible wall temperature exceeds about 1500° C. Thus, there is a risk that a vitreous crucible will buckle at the sidewalls or otherwise deform before an ingot can be completely grown. Deformation occurs most often during remelt of an imperfect crystal or melting of bead polycrystalline silicon (i.e., granular polycrystalline silicon formed in a fluidized bed).

To meet the demand for larger semiconductor wafers, crystal growers have grown larger ingots. Silicon ingots grown by the Czochralski method can now be more than 300 mm in diameter and up to a meter or more in length. If the trend continues, ingots grown in the future will be even larger. Processes for growing larger ingots can be even more demanding on crucibles than processes for growing smaller ingots. Growing a larger ingot generally requires melting a larger charge of semiconductor material in a larger crucible. The additional weight of the crucible and the larger forces applied to the crucible sidewall by the larger melt subject the crucible to higher stresses. Because more heat is required to melt the larger charge of semiconductor material and to maintain the desired melt temperature throughout the process of growing a larger ingot, the crucible may also need to be subjected to higher temperatures. Moreover, it takes longer to grow a larger ingot, which means the crucible has to withstand the stresses and heat longer.

Graphite susceptors are used to support vitreous silica crucibles because at high temperatures graphite is more resilient than vitreous silica. Graphite does not flow at typical crystal growth temperatures and thus is an adequate support for the fused silica. For instance, one common susceptor 9 includes a base 11 and two semi-cylindrical supports 13. (See FIGS. 1 & 2). A retainer 17 on the base 11 holds the lower ends of the supports 13 together in abutting relation. The seams between the supports 13 are known as susceptor splits 19.

Although graphite susceptors prolong the useable life of crucibles, classical split susceptor designs do not eliminate deformation problems from crucibles. Further, the susceptor design can influence the progression of crucible deformation. For instance, when the susceptor 9 shown in FIGS. 1 and 2 supports a vitreous silica crucible 21 in a high-temperature environment, the thermal expansion causes the supports 13 to open, as shown in FIG. 1. The retainer 17 holds the lower ends of the supports 13 relatively closer together while the susceptor splits 19 open wider near the top of the crucible 21. FIGS. 1 and 2 show exaggerated opening of the splits 19 near the rim of the crucible 21. Because the splits 19 allow the crucible 21 to expand more near its rim than near its bottom, the resulting stresses and elastic memory of the vitreous silica body of the crucible 21 tend to cause parts of the crucible sidewall 25 adjacent to the splits 19 and near the top of the crucible 21 to deform inwardly. Parts of the crucible sidewall 27 at the midpoints between the susceptor splits 19 on the circumference of the crucible 21 and near the top of the crucible tend to deform outwardly. Thus, after being subjected to high temperatures, the top of the crucible 21 tends to deform into an oval shape as shown in FIG. 2 in which the deformation has been exaggerated for clarity.

Deformation of the crucible can bring the crystal growing process to a premature end because it can prevent the crucible from being raised. For example, FIG. 3 shows a susceptor 31 supporting a crucible 33 inside a Czochralski crystal puller 35. The crystal puller 35 has a heat shield assembly 37 to shield the growing ingot 39 from heat and help it cool. As shown in FIG. 3, the crucible 33 is very near the upper limit of its vertical travel in the crystal puller 35. Some clearance 41 (not to scale) is provided between the crucible 33 and the heat shield assembly 37 to allow the rim of the crucible to be raised above the bottom of the heat shield assembly 37. Deformation of the crucible 33 can eliminate the clearance 41, making it impossible to raise the crucible further without striking the heat shield assembly 37. Thus, limited clearance between the crucible and other parts of the ingot growing apparatus, as exemplified by the system shown in FIG. 3, is one limit on the tolerance for crucible deformation.

Deformed crucibles also increase the risk of melt contamination. Deformation of the crucible can create pockets between the crucible and susceptor in which SiO from the crucible can react with the graphite susceptor to produce CO gas. The CO gas can react with the melt, resulting in SiC particulate formation in the melt. There is also an increased risk that particulate matter from the sidewall of a deformed crucible will fall into or otherwise contaminate the melt. Contamination of the melt results in the ingot having dislocations, impurities, or other defects. Thus, tolerance for crucible deformation is also limited by quality control factors.

Vitreous crucibles can be strengthened by applying a devitrification promoter to the inner and/or outer surfaces of the crucible sidewall. At high temperatures the devitrification promoter induces the coated surface to crystalize, thereby becoming cristobalite rather than vitreous silica. Because the devitrified portion of the crucible has more rigidity than the vitreous silica, the devitrification promoter coating results in the heated crucible sidewall having enhanced stiffness. Thus, continuous devitrification promoter coatings have been applied to the inner and/or outer surfaces of crucible sidewalls to make the crucible more resistant to plastic deformation. A variety of devitrification promoters, including calcium, barium, and strontium, are well-known to those skilled in the art.

Although the prior art crucibles having coated sidewalls are more resistant to buckling, their surfaces unfortunately tend to develop cracks in the devitrified layer. These cracks can be deep and stress induced. The devitrification induced by the devitrification promoter coating generally does not extend through the entire sidewall. Instead the coating results in a devitrified shell overlying vitreous silica. The tendency of the vitreous part of the sidewall to flow causes stresses in the devitrified shell. Further, the cristobalite and vitreous silica have different coefficients of thermal expansion. The mismatched expansion and/or stresses can cause a crack to form on the sidewall. If a crack forms on the inner surface, it is a potential source of particulates in the melt, which can result in defects in the crystal ingot. If a crack forms on the outer surface, there is a risk that the molten semiconductor material will dissolve through the now thinner sidewall and leak out of the crucible. Thus, cracks on a crucible can also bring a crystal growing process to a premature end.

FIGS. 4-5 show the same susceptor 9 discussed in connection with FIGS. 1-2, holding a crucible 51. The supports 13 are broken partially away at the split 19 in FIG. 4 to reveal more of the crucible. A devitrified shell 53 has been formed on the outer surface of the sidewall by application of a continuous coating of a devitrification promoter to the outer surface of the crucible sidewall. Because of the devitrified shell 53, the crucible 51 maintains its shape (FIG. 5) throughout a crystal growing process. Unfortunately, cracks 55 have formed on the crucible 51 sidewall adjacent to the midpoints 57 between the susceptor splits 19 on the circumference of the crucible. This is a typical pattern for crack formation.

SUMMARY OF INVENTION

A crucible of the present invention for holding melted semiconductor material has a body of vitreous silica having an open top. The vitreous body includes a bottom wall and a sidewall extending up from the bottom wall. The bottom wall and sidewall define a cavity for holding the semiconductor material. The sidewall has an inner surface and an outer surface. A devitrification promoter coating is on a first area of at least one of the inner and outer surfaces of the sidewall. A second area of at least one of the inner and outer surfaces of the sidewall is substantially free from any devitrification promoter coating. At least one of said inner and outer surfaces of the sidewall includes at least a part of said first and second areas.

Another embodiment of the present invention is a crucible for holding melted semiconductor material. The crucible has a body of vitreous silica having an open top, a bottom wall and a sidewall extending up from the bottom wall. The bottom wall and sidewall define a cavity for holding the semiconductor material. The sidewall has an inner surface and an outer surface. The sidewall has at least one enhanced stiffness sidewall portion and at least one stress accommodating sidewall portion. Each enhanced stiffness sidewall portion is at least partially devitrified and each stress accommodating sidewall portion is substantially free of devitrification. At least one of said inner and outer surfaces of the sidewall includes at least part of both said enhanced stiffness sidewall portion and said stress accommodating sidewall portion and at least part of the enhanced stiffness sidewall portion is closer to the open top of the crucible than at least part of the stress accommodating sidewall portion.

BRIEF DESCRIPTION OF THE DRAWINGS

Corresponding reference characters indicate corresponding parts throughout the drawings.

DETAILED DESCRIPTION OF INVENTION

Figure 1:
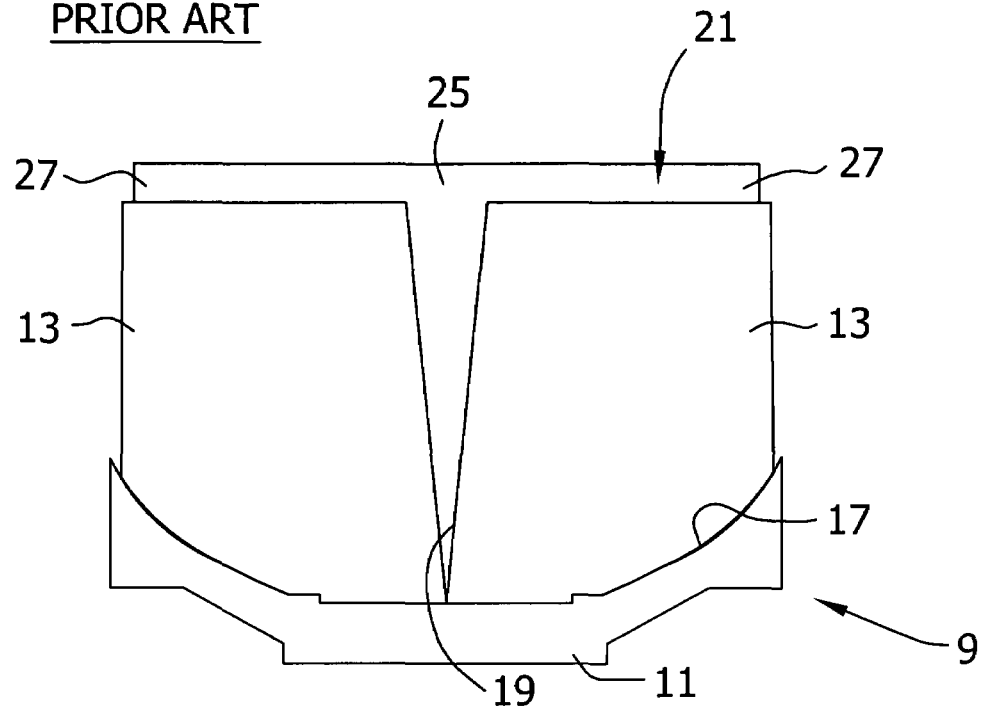
FIG. 1 is a schematic elevation of a prior art vitreous silica crucible supported by a susceptor having splits.
Figure 2:
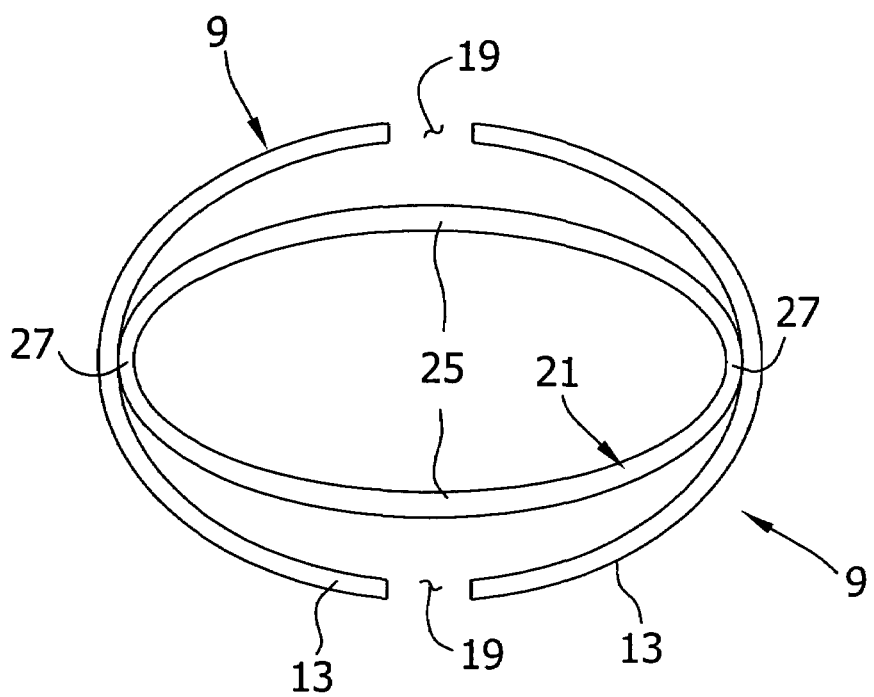
FIG. 2 is a schematic plan view showing only the top of the silica crucible and susceptor shown in FIG. 1 and illustrating a typical oval crucible deformation pattern associated with the position of the susceptor splits.
Figure 3:
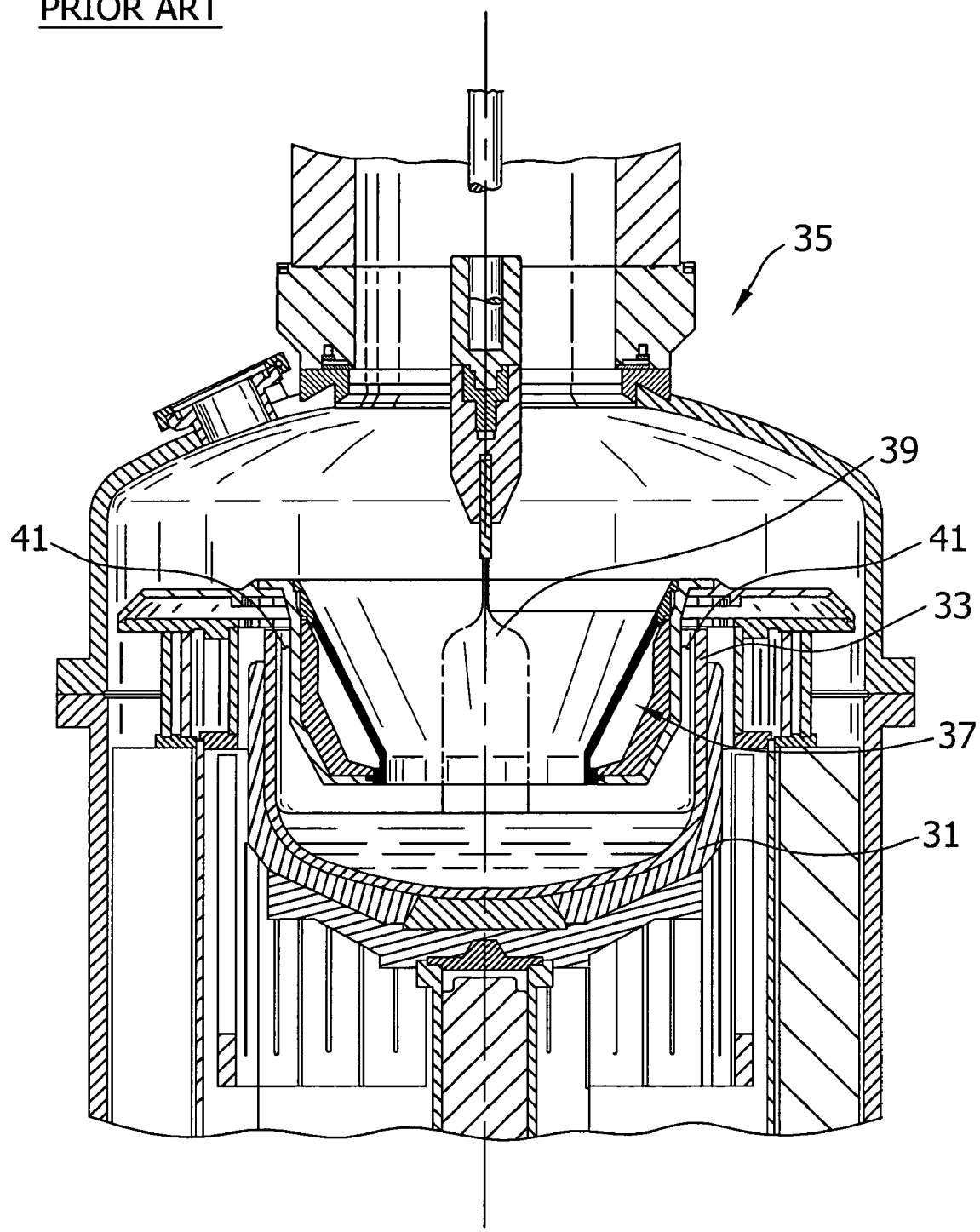
FIG. 3 is a cross sectional elevation of a Czochralski crystal puller having a closed hot zone that would limit upward movement of a deformed crucible.
Figure 4:
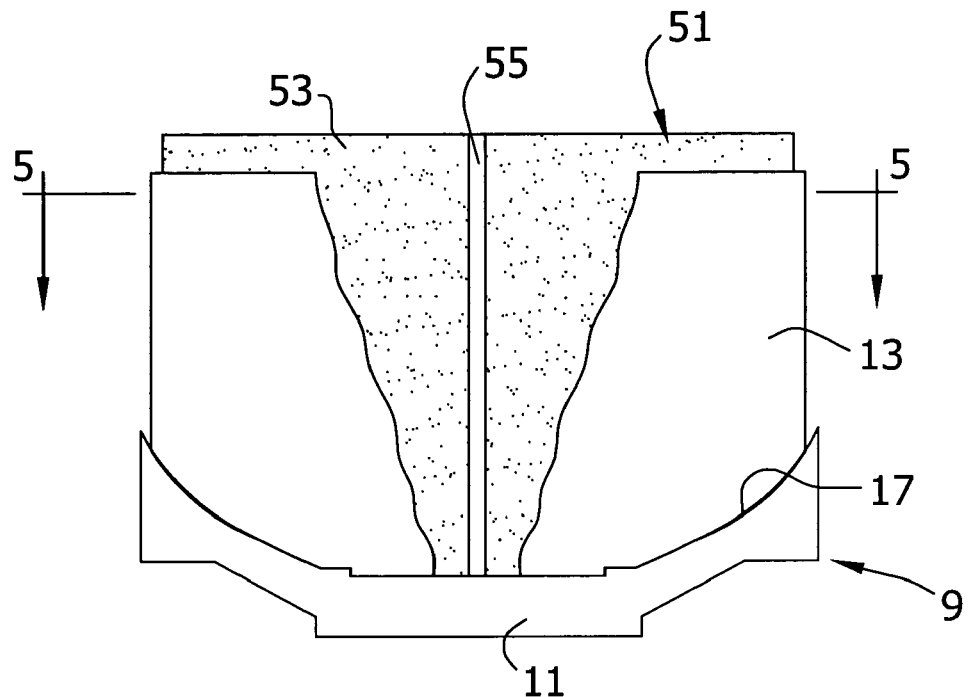
FIG. 4 is a schematic elevation of a prior art vitreous silica crucible and susceptor, wherein the crucible has a devitrification promoter coating on its outer sidewalls and a portion of the susceptor has been removed to show a crack on the surface of the crucible.
Figure 5:
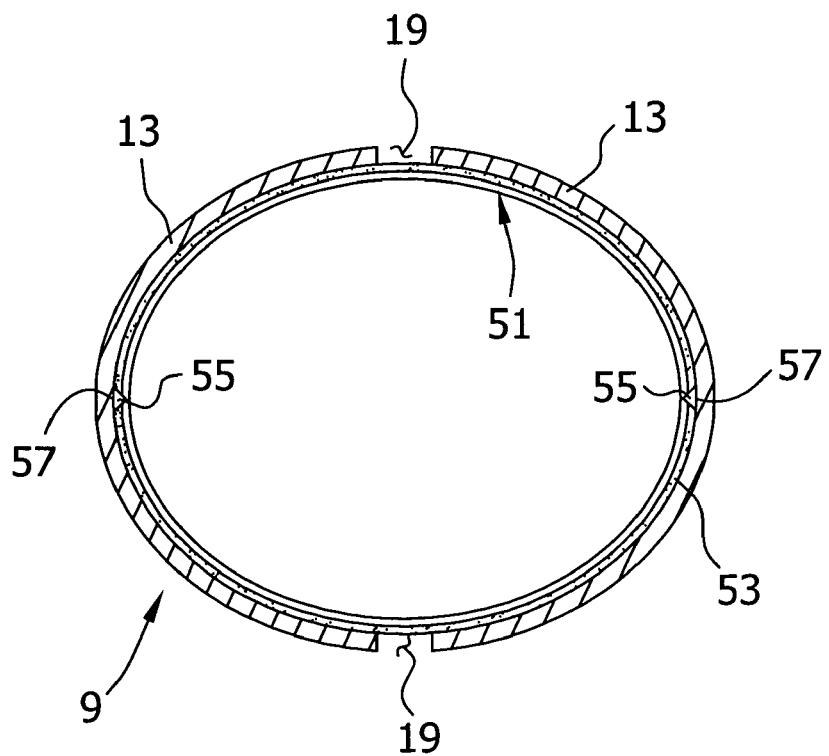
FIG. 5 is a cross section of the crucible and susceptor shown in FIG. 4 taken through plane 5-5 on FIG. 4.
Figure 6:
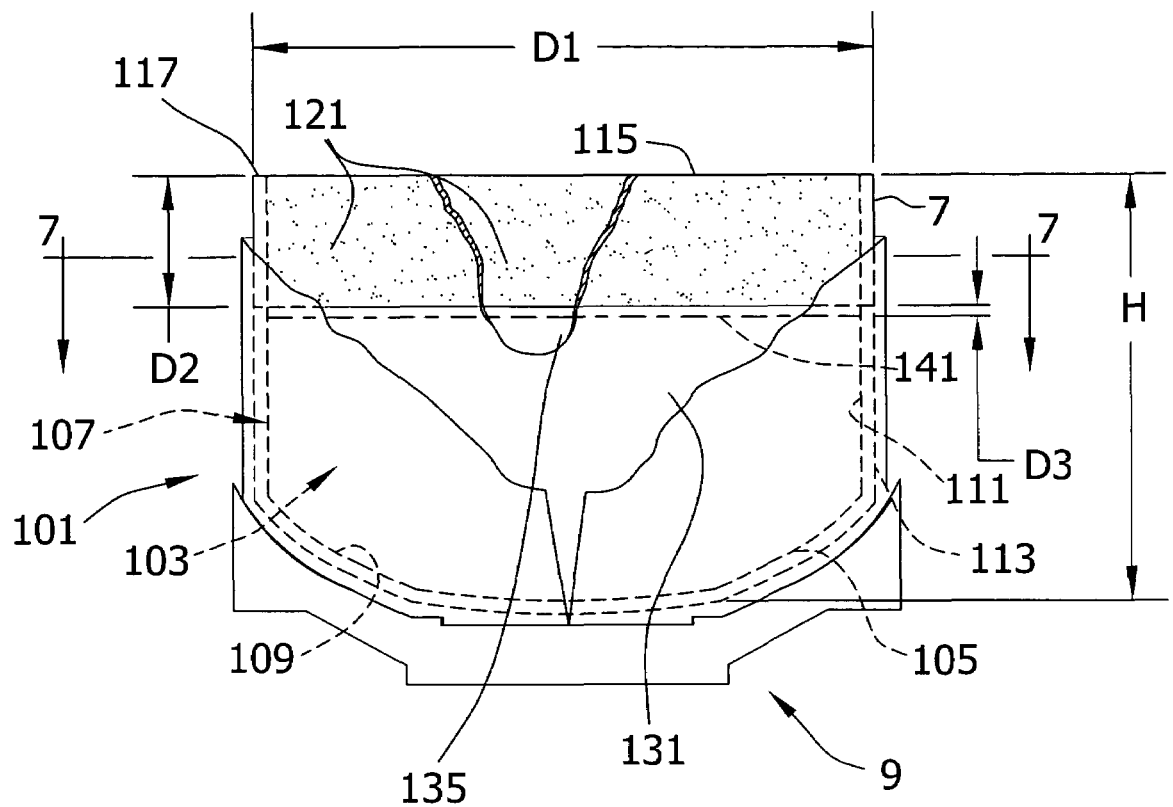
FIG. 6 is a schematic elevation of one exemplary crucible of the present invention held by a susceptor wherein portion of the susceptor has been removed to show a devitrified shell on a part of the outer surface of the crucible sidewall and a portion of the crucible has been removed to show a devitrified shell on part of the inner surface of the crucible sidewall.
Figure 7:
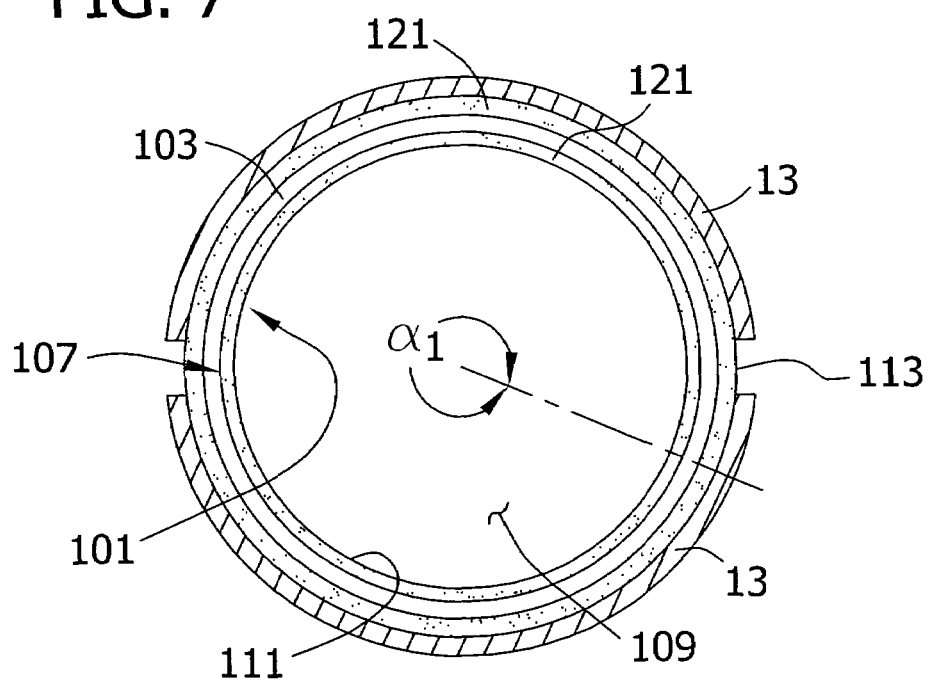
FIG. 7 is a cross section of the crucible and susceptor shown in FIG. 6 taken through plane 7-7 on FIG. 6.

Referring now to the drawings, and more particularly to FIGS. 6 and 7, a crucible constructed according to the principles of the present invention, generally designated 101, has a vitreous body 103. Preferably, the vitreous body 103 comprises vitreous silica (i.e., fused quartz). The vitreous body 103 comprises a bottom wall 105 and a sidewall 107 extending up from the bottom wall. The bottom wall 105 and sidewall 107 define a cavity 109. The sidewall has an inner surface 111 and an outer surface 113. The sidewall forms a rim 117 at a top 115 of the crucible, which is open. In one embodiment, the crucible 101 has an outer diameter D1 of at least about 55 cm and a height H that is at least about 38 cm.

A devitrification promoter is on an area 121 of the surface of the crucible 101 that has been selected to become an enhanced stiffness sidewall portion upon heating of the crucible. The devitrification promoter (e.g., substances including calcium, strontium, or barium) is capable of inducing devitrification of the surface of the sidewall 107 at high temperatures (e.g., temperatures above about 1400° C.). It will be understood that virtually any devitrification promoter can be used without departing from the scope of the present invention. Moreover, it is envisioned that enhanced stiffness sidewall portions can be created other than by devitrification promoters, such as by applying separate pieces of solid material to the crucible. For example, one can reduce flow of the vitreous silica in selected areas by applying reinforcements (e.g., carbon fibers) to the crucible as long as: (i) there is sufficient tolerance for any resulting particulate formation in the melt; (ii) the reinforcements can withstand the high temperatures of the process; and (iii) an adequate bond can be maintained between the reinforcements and the crucible throughout the process. The area 121 selected to become an enhanced stiffness sidewall portion extends around the full circumference of the body 103 adjacent to the top 115 on both the inner 111 and outer surfaces 113 of the sidewall 107 and on the rim 117. The area 121 coated with the devitrification promoter extends down from the rim 117 a distance D2 on both the inner 111 and outer surfaces 113 of the sidewall 107. Because the area 121 extends from the outer surface 113 over the rim 117 to the inner surface 111, it can either be viewed as one continuous area extending over the inner and outer surfaces or two areas (one on the inner surface and one on the outer surface) which adjoin at the top 115 of the crucible 101. Note that the part of the inner surface 111 included in the area 121 selected to become an enhanced stiffness sidewall portion is in registration with the part of the outer surface 113 included in the area 121 selected to become an enhanced stiffness sidewall portion (i.e., the parts of the inner and outer surfaces subtend the same solid angle $\alpha 1$—see FIG. 7). The length of D2 (FIG. 6) is preferably selected in reference to the amount of semiconductor material to be melted in the crucible 101 as will be explained in more detail below.

Also, an area 131 on the outer surface 113 of the sidewall 107 has been selected to become a stress accommodating sidewall portion upon heating of the crucible 101. The area 131 selected to become a stress accommodating sidewall portion has a surface that is substantially free from any devitrification promoters. As shown in FIG. 6, all parts of outer surface 113 of the sidewall 107 that are below the area 121 selected to become an enhanced stiffness sidewall portion are included in the area 131 selected to become a stress accommodating sidewall portion. Likewise, another area 135 on the inner surface 111 of the sidewall 107 has also been selected to become a stress accommodating sidewall portion upon heating of the crucible 101. This area 135 of the inner surface 111 is substantially free from any devitrification promoters. Further, all parts of the inner surface 111 of the sidewall 107 that are below the area 121 selected to become an enhanced stiffness sidewall portion are included in the area 135 selected to become a stress accommodating sidewall portion.

Referring to FIG. 6, when the crucible 101 is being used, the melt (not shown) will occupy at least some of the cavity 109. Thus, parts of the inner surface 111 of the sidewall 107 that contact the melt will be wetted by the melt. As those skilled in the art know, the maximum volume of the melt and a melt level plane 141 below which the inner surface 111 will be wetted by the melt and above which the inner surface will not be wetted by the melt are known before any ingot growing process begins. In the exemplary embodiment, shown in FIG. 6, the length of D2 is selected so a distance D3 separates the bottom of the area 121 selected to become an enhanced stiffness sidewall portion from this plane 141. It may be desirable for D3 to be relatively short so the area 121 selected to become the enhanced stiffness sidewall portion includes almost all parts of the crucible 101 that are above the melt line 141. However, D3 can be longer without departing from the scope of this invention. For example, in one embodiment D3 is about 1 mm. In another embodiment D3 is about 10 mm. In still another exemplary embodiment D3 is about 20 mm. In yet another exemplary embodiment D3 is about 50 mm. The length of D2 will vary inversely with the length of D3. Typically, D2 will be on the order of about 7-10 cm when the bottom of the area 121 selected to become the enhanced stiffness sidewall portion is just slightly above the melt level plane 141. Conversely, all areas 131, 135 of the inner 111 and outer surfaces 113 adjacent to and below the melt level plane 141 have been selected to become stress accommodating sidewall portions.

Figure 8:
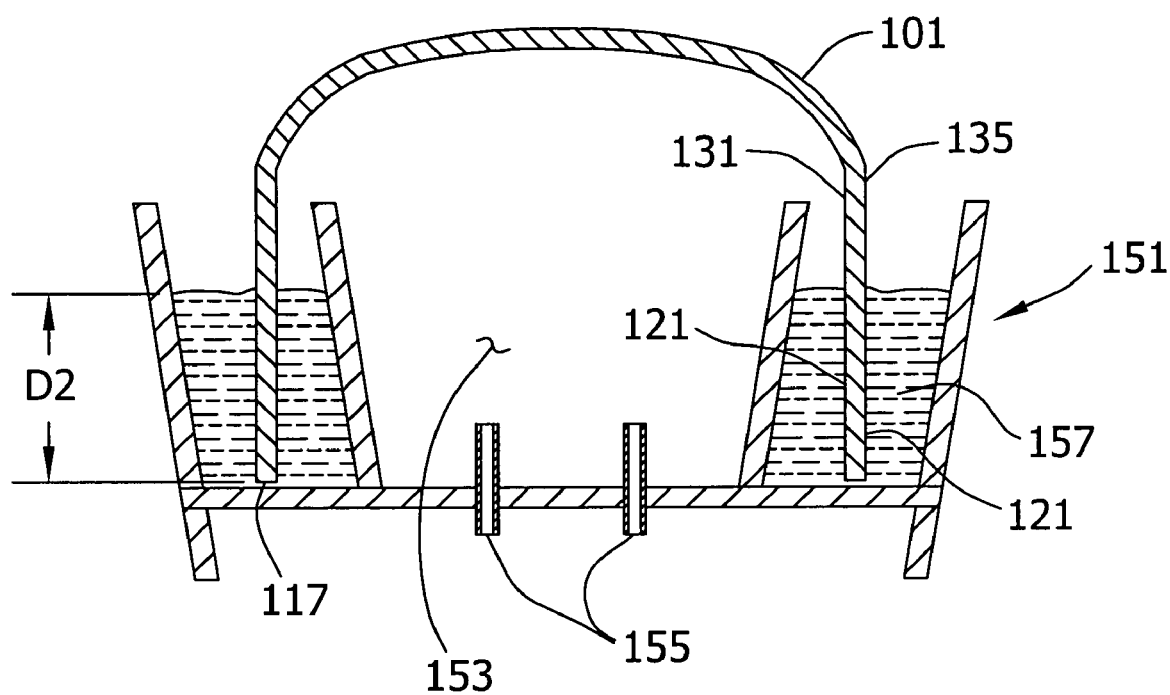
FIG. 8 is a schematic diagram of an inverted crucible being partially submerged in a devitrification promoter solution.

The devitrification promoter can be applied to the sidewall 107 by any method including spraying, brushing, or otherwise applying a solution comprising a devitrification promoter onto the area 121 selected to become the enhanced stiffness sidewall portion 123. The exemplary crucible 101 shown in FIGS. 6-7 can be made by inverting a conventional uncoated vitreous silica crucible and partially submerging it in a solution 157 including a devitrification promoter. For example, one can partially submerge the crucible 101 in an annular tank 151 (shown in FIG. 8) having an inner cavity 153 equipped with pressure equalization vents 155 in fluid communication with the ambient environment to prevent pressure from building up inside the crucible 101 as it is being submerged. Because the vents 155 equalize the pressure, the inner surface 111 is submerged in the solution 157 to the same depth (e.g., D2) as the outer surface 113. By preventing the areas 131, 135 selected to become stress accommodating sidewall portions from being submerged in the solution 157, they remain substantially free from devitrification promoters. The crucible 101 can remain in its inverted position on a drying rack to keep the devitrification promoter off the areas 131, 135 selected to become stress accommodating sidewall portions. A crucible 101 of the present invention can also be produced by applying a devitrification promoter to larger areas of the crucible and using an acid (e.g., HCl) to remove any devitrification promoters from the areas 131, 135 selected to become stress accommodating sidewall portions.

In one exemplary crystal growing process, the crucible 101 is supported in a Czochralski crystal puller by a graphite susceptor having splits. As shown in FIGS. 6-7, for example, the crucible can be supported by the same susceptor 9 discussed above. Operation of crystal pullers is known and need not be described in detail, other than to note the performance of the crucible 101. As the crucible and semiconductor material are heated in the ordinary course of operation of the crystal puller, the devitrification promoter induces the surface of the area 121 selected to become the enhanced stiffness sidewall portion to devitrify. The devitrification may extend through the entire sidewall 107 if the sidewall is thin enough and the crucible 101 remains heated for a sufficient time, but in general the enhanced stiffness sidewall portion 121 will be a devitrified shell overlying the vitreous body 103 as shown in FIG. 7. In any case, the devitrification is sufficiently thick that it functions to provide additional support to the crucible 101, as may be determined empirically, by measurement of the thickness of the devitrification, and/or by other known methods of stress analysis. Thus, the promoter induced devitrification forms the enhanced stiffness sidewall portion 121 thereby adding rigidity to the sidewall 107 and making the crucible 101 more resistant to buckling or other plastic deformation. Because the part of the inner surface 111 of the sidewall 107 selected to become the enhanced stiffness sidewall portion 121 is in registration with the part of the outer surface 113 selected to become the enhanced stiffness sidewall portion, the devitrification of the inner surface 111 works in cooperation with the devitrification of the outer surface 113 (See FIG. 7), resulting in more than twice the resistance to buckling where there is registration.

In contrast, the areas 131, 135 selected to become stress accommodating sidewall portions remain substantially vitreous. They soften as they are heated and flow to relieve thermal and/or mechanical stresses in the crucible 101. Thus, these areas 131,135 of the sidewall 107 become stress accommodating sidewall portions when the crucible is heated. This makes the crucible 101 more resistant to formation of cracks on the inner 111 and outer surfaces 113. Thus, the crucible 101 can remain in the high temperature environment of the crystal puller for a longer time before it needs to be replaced. Consequently, the crucible 101 can yield more ingots than conventional crucibles. Further, pressure from the melt tends to push the sidewall 107 outward into the susceptor supports 13 because areas of the sidewall 107 that are wetted (i.e., below the melt level plane 141) include stress accommodating sidewall portions. This is advantageous because it ensures the susceptor 9 supports the crucible 101 more evenly and can eliminate undesirable gaps between the crucible 101 and susceptor 9. It is also desirable to provide stress accommodation in areas adjacent to the upper surface of the melt because the molten material can adhere to the inner surface 111 of the sidewall 107 and solidify as the melt subsides with respect to the sidewall. Solidification of the melt on the sidewall 107 can create local stresses in the sidewall. Moreover, the sidewall 107 may experience a larger thermal gradient in the vicinity of the upper surface of the melt than elsewhere on the sidewall, which can also result in local stresses. Because the stress accommodating sidewall portions 131,135 include all parts of the inner 111 and outer surfaces 113 of the sidewall 107 adjacent to and below the melt level plane 141, local stresses associated with solidification of the melt on the sidewall 107 and thermal gradients in the sidewall 107 are relieved by flow of the vitreous stress accommodating sidewall portions and do not damage the crucible 101.

Conversely, because the area 121 selected to become the enhanced stiffness sidewall portion extends around the circumference of the crucible 101 adjacent to the top 115, additional rigidity is provided at the top of the crucible where deformation is typically initiated. Because the crucible 101 resists deformation, it is less likely that the crucible will strike parts of a crystal puller as it is raised. Further, selecting the length of D2 so substantially all parts of the sidewall 107 that are more than a short distance D3 above the melt level plane 141 are included in the enhanced stiffness sidewall portion 121, provides the maximum additional rigidity that can be obtained without restricting stress relief in the parts of the sidewall 107 adjacent to and below the melt level plane 141.

The exemplary embodiment shown in FIGS. 6-7 can be varied substantially without departing from the scope of the invention. For instance, the crucible 101 can have any size and shape. Likewise, the area 121 selected to become an enhanced stiffness sidewall portion can also have any size and shape and can be separated into any number of discrete areas selected to become enhanced stiffness sidewall portions. The area(s) selected to become the enhanced stiffness sidewall portion(s) can also include parts of the sidewall that are below the melt line as long as adequate stress accommodation is provided. Further, the area(s) selected to become the enhanced stiffness sidewall portion(s) may be limited to only the inside or only the outside surface of the sidewall. Conversely, the areas 131, 135 selected to become the stress accommodating sidewall portions can also have any size and shape. Whereas two areas 131, 135 are selected to become stress accommodating sidewall portions in the exemplary embodiment, a single area on the inner surface, outer surface, or both could have been selected without departing from the scope of this invention. Likewise, any number of additional areas could also be selected to become stress accommodating sidewall portions. Further, the area(s) selected to the become stress accommodating sidewall portion(s) can extend farther above the melt line on the inner and/or outer surfaces of the sidewall as long as there is adequate rigidity to resist buckling. It should also be noted that the melt itself may be doped with a devitrification promoter, such as is disclosed in U.S. Pat. No. 6,461,427, which is incorporated by reference, without affecting whether or not the part of the inner surface wetted by the melt becomes an enhanced stiffness sidewall portion. The amount of devitrification produced by doping the melt with a devitrification promoter, while desirable in some cases from a standpoint of ingot quality, is not sufficient to provide any functional stiffness enhancement to the sidewall of the crucible.

Figure 9:
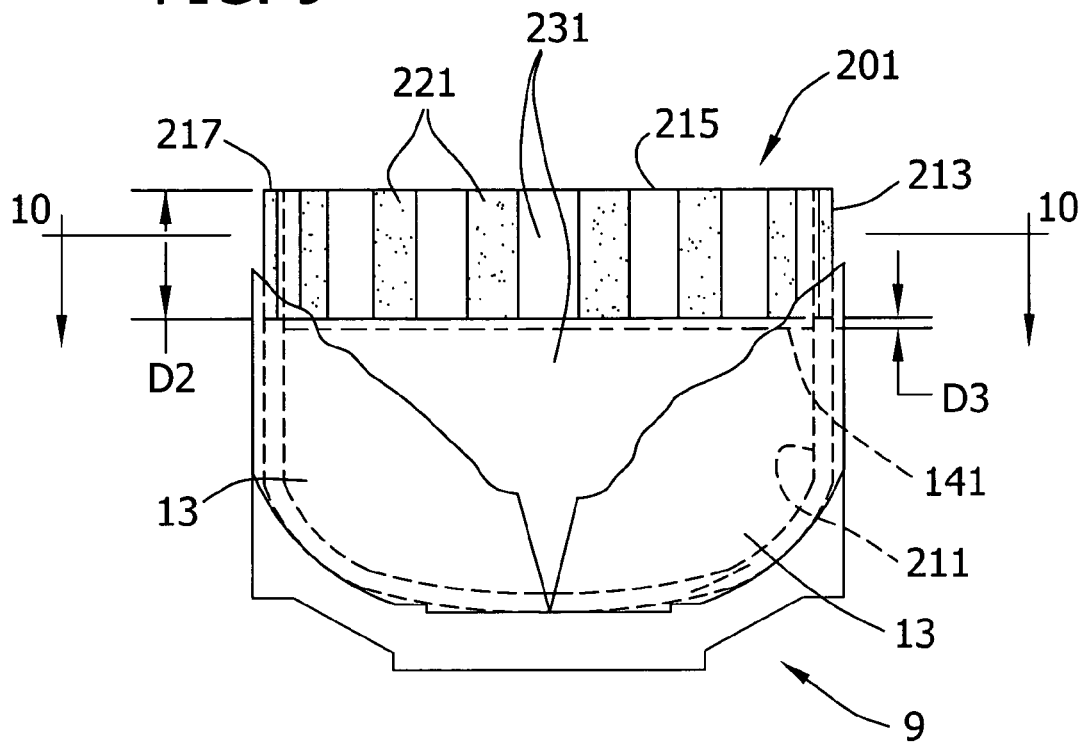
FIG. 9 is a schematic elevation of another exemplary crucible of the present invention in which a plurality of circumferentially spaced areas have been selected to become enhanced stiffness sidewall portions.
Figure 10:
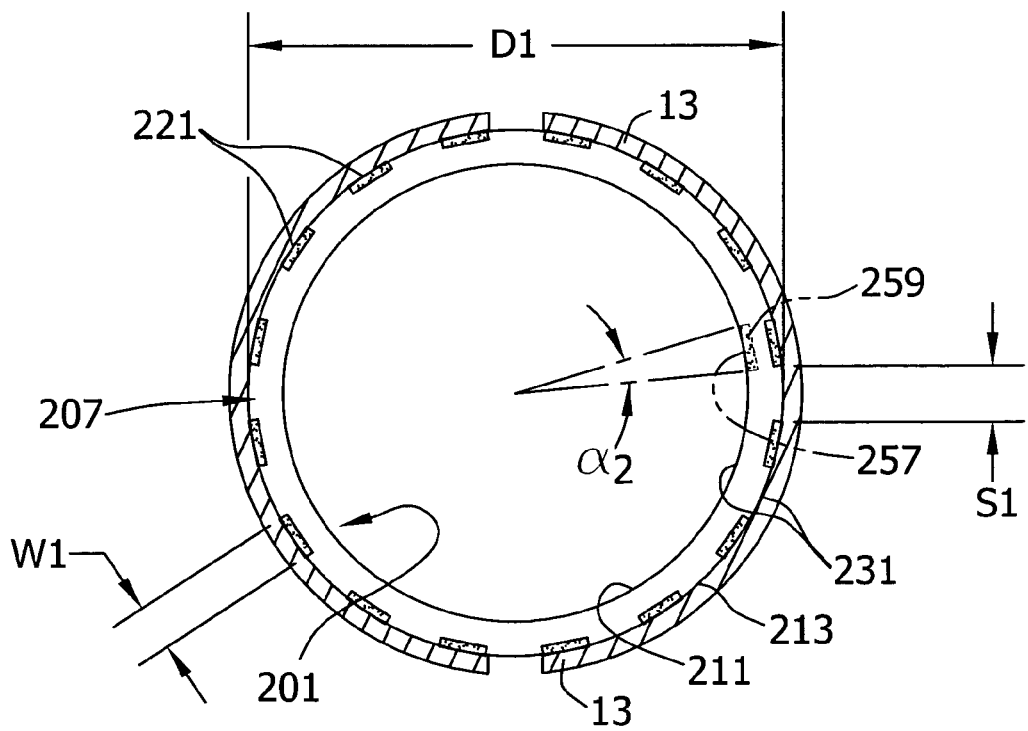
FIG. 10 is a cross section of the crucible shown in FIG. 9 taken through plane 10-10 on FIG. 9.

FIGS. 9 and 10 show a crucible 201 that is substantially the same as crucible 101, except as noted. The outer surface 213 of the crucible 201 comprises 16 discrete areas 221 that have been selected to become enhanced stiffness sidewall portions. The areas 221 selected to become the enhanced stiffness sidewall portions are spaced apart from each other circumferentially around the outer surface 213 of the sidewall 207 adjacent to the top 215 of the crucible 201. Each of the 16 areas 221 extends down from the top 215 of the crucible 201 a distance D2, which is preferably selected as described previously. Whether the areas 221 include part of the rim 217, extend precisely to the rim 217, or are merely adjacent to the rim 217 is of less significance because the rim 217 and parts of the sidewall 207 adjacent to the top 215 do not bear much of the weight of the crucible 201. Each of the 16 areas 221 has a width W1. Further, a distance S1 separates each of the 16 areas 221 from its neighbors. In one exemplary embodiment, the crucible 201 has a diameter D1 that is about 71 cm, W1 is about 127 mm, and S1 is about 12 mm. A devitrification promoter is on the outer surface 213 of the sidewall 207 at each of the 16 areas 221. The area 231 including the remainder of the outer surface 213 as well as the entire inner surface 211 has been selected to become a stress accommodating sidewall portion. Thus, this area 231 has a surface that is substantially free from any devitrification promoters.

The crucible 201 can be made by applying a coating of devitrification promoter to the areas 221 selected to become enhanced stiffness sidewall portions and preventing the devitrification promoter from contacting the area 231 selected to become the stress accommodating sidewall portion. For instance, a solution comprising a devitrification promoter can be applied to the areas 221 selected to become enhanced stiffness sidewall portions with a sprayer, brush or roller. Due care or other steps (e.g., masking) can be taken to prevent the solution from contacting the area 231 selected to become the stress accommodating sidewall portion. An acid (e.g., HCl) can also be applied to parts of a crucible that have been coated with a devitrification promoter to remove the devitrification promoter from the area 231 selected to become the stress accommodating sidewall portion.

The crucible 201 operates substantially the same as the previously described crucible 101 except that the 16 discrete areas 221 become 16 discrete enhanced stiffness sidewall portions upon heating of the crucible 201 and the stress accommodating sidewall portion 231 is softened by the heat. Further, the enhanced stiffness sidewall portions 221 are separated from each other by the stress accommodating sidewall portion 231, which acts like an expansion joint between each of the enhanced stiffness sidewall portions 221 by relieving stress that would otherwise be associated with a large continuous devitrified shell on the surface of the crucible 201.

There is room for substantial variation in the number of areas 221 selected to become enhanced stiffness sidewall portions as well as the values of W1 and S1 without departing from the scope of this invention. It is desirable, however, that S1 be sufficiently large to reduce the buildup of stress in the sidewall 207 caused by the enhanced stiffness sidewall portions 221. However, the amount of space S1 between adjacent areas 221 can vary from one location to another, either with or without regard to symmetry of the spacing of the areas about the circumference of the crucible 201. The areas selected to become enhanced stiffness sidewall portions can also have virtually any size and shape, including a size and shape that is different from the size and shape of any number of the other areas (not shown). Further, any number of the areas 221 can be on the inner surface 211 of the sidewall 207 and any number of the areas 221 can be on the outer surface 213 of the sidewall 207. Moreover, some or all parts of the inner surface 211 of the sidewall 207 that are in registration with the areas 221 on the outer surface 213 can also be selected to become enhanced stiffness sidewall portions (and vice-versa) to provide additional rigidity to the sidewall 207 without restricting flow between the enhanced stiffness sidewall portions. For instance, an area 257 on the inner surface 211 subtending the same angle $\alpha 2$ as one of the areas 221 on the outer surface 213 could haven been selected to become an enhanced stiffness sidewall portion.

Figure 11:
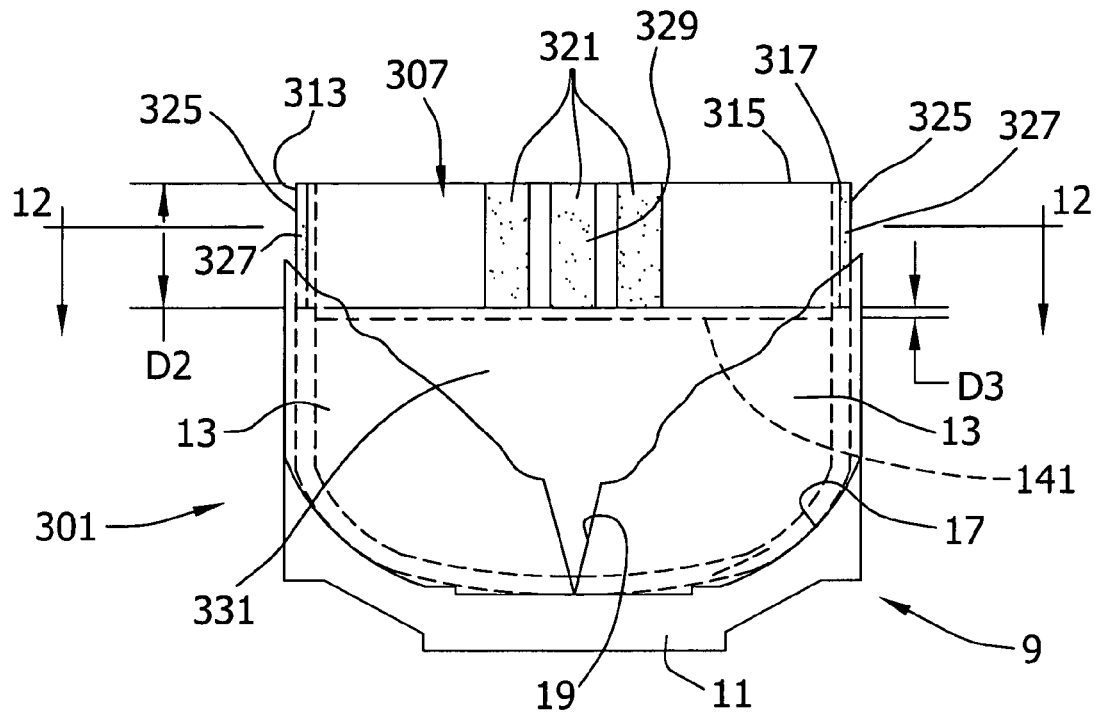
FIG. 11 is a schematic elevation of another exemplary crucible of the present invention in which a plurality of circumferentially spaced areas have been selected to become enhanced stiffness sidewall portions.
Figure 12:
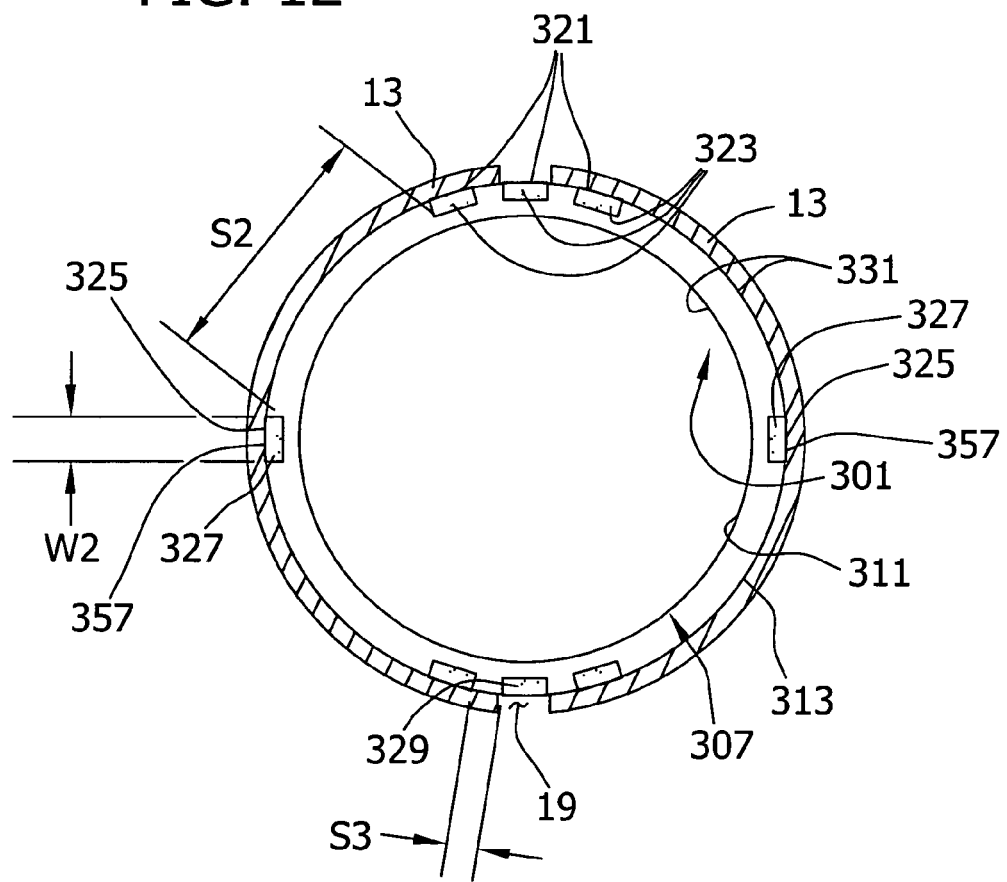
FIG. 12 is a cross section of the crucible shown in FIG. 8 taken through plane 12-12 on FIG. 11.

Another exemplary crucible 301 of the present invention is shown in FIGS. 11 and 12. The crucible 301 is substantially the same as crucible 201, except in the selection of areas to become enhanced stiffness sidewall portions. The crucible 301 is supported by the susceptor 9 discussed previously. Areas 321 on the outer surface 313 of the sidewall 307 which will be located adjacent to each split 19 when the crucible 301 is received in the susceptor 9 have been selected to become enhanced stiffness sidewall portions. As shown in FIGS. 11 and 12, three of the areas 321 are adjacent each split 19. Areas 325 on the outer surface 313 of the sidewall 307 which will be located adjacent to each midpoint 357 between the splits 19 on the circumference of the crucible 301 when the crucible is received in the susceptor 9 have also been selected to become enhanced stiffness sidewall portions. Each of the eight areas 321, 325 selected to become enhanced stiffness sidewall portions has a width W2 and extends down the sidewall 307 from the rim 317 a distance D2, which is preferably selected as discussed above. A distance S2 separates the areas 321 adjacent to the splits 19 from the neighboring areas 325 adjacent to the midpoints 357 between the splits 19. A distance S3 separates the middle area 329 of the three areas 321 adjacent to the splits 19 from each of its neighbors. The area 331 including the remainder of the outer surface 313 and the entire inner surface 311 has been selected to become a stress accommodating sidewall portion. The values of S2, S3 and W2 can vary extensively, but S3 is preferably sufficient in length to reduce buildup of stress from the enhanced stiffness sidewall portions 321. Again, a devitrification promoter is on the areas 321, 325 selected to become enhanced stiffness sidewall portions and the area 331 selected to become a stress accommodating sidewall portion has a surface that is substantially free from any devitrification promoters.

The crucible 301 can be made by applying the devitrification promoter to the areas 321, 325 selected to become enhanced stiffness sidewall portions and/or by using an acid (e.g., HCl) to remove devitrification promoters from the area 331 selected to become a stress accommodating sidewall portion with acid, as described previously. As the crucible 301 is heated, the areas 321, 325 devitrify, thereby forming enhanced stiffness sidewall portions which add rigidity to the crucible 301. Conversely, the stress accommodating sidewall portion 333 is softened by the heat. Because the enhanced stiffness sidewall portions 321, 325 are adjacent to the susceptor splits 19 and adjacent to the midpoints 357 between the susceptor splits 19, the crucible 301 has additional structural support at the locations where deformation would otherwise be most likely to occur. However, the stress accommodating sidewall portion 331 extends between the enhanced stiffness sidewall portions 321, 325, which allows the sidewall 307 to flow between the enhanced stiffness sidewall portions, thereby relieving stresses in the crucible 301.

The crucibles described above can be varied extensively without departing from the scope of the present invention. For instance the number, sizes, shapes, and positions of the areas 321, 325 selected to become enhanced stiffness sidewall portions (and conversely the number, sizes, shapes, and positions of the areas selected to become stress accommodating sidewall portions) can be optimized for crucibles having virtually any geometry. The foregoing optimization can also tailor a crucible for use with virtually any susceptor design.

When introducing elements of the present invention or the preferred embodiments thereof, the articles "a", "an", "the" and "said" are intended to mean that there are one or more of the elements. The terms "comprising", "including", and "having" are intended to be inclusive and mean that there may be additional elements other than the listed elements.

As various changes could be made in the above constructions and methods without departing from the scope of the invention, it is intended that all matter contained in the above description and shown in the accompanying drawings shall be interpreted as illustrative and not in a limiting sense.

What is claimed is:

1. A crucible holding melted semiconductor material, the crucible comprising:
    a body of vitreous silica having an open top, a bottom and a sidewall extending up from the bottom, the bottom and sidewall defining a cavity holding the semiconductor material in the crucible below a level of the melted semiconductor material, the sidewall having an inner surface, an outer surface, an enhanced stiffness sidewall portion and a stress accommodating sidewall portion at least part of which is positioned below said enhanced stiffness sidewall portion, the enhanced stiffness sidewall portion being at least partially devitrified and the stress accommodating sidewall portion being substantially free of devitrification so that the stress accommodating sidewall portion accommodates stress in the sidewall,
    wherein at least one of said inner and outer surfaces of the sidewall includes at least part of both said enhanced stiffness sidewall portion and said stress accommodating sidewall portion, and
    wherein the body of the crucible is substantially free of enhanced stiffness sidewall portions below the level of the melted semiconductor material.

2. The crucible of claim 1 wherein the sidewall has a plurality of enhanced stiffness portions including said enhanced stiffness portion, said plurality of enhanced stiffness portions being spaced apart circumferentially about the sidewall.

3. The crucible of claim 2 wherein the sidewall has a plurality of enhanced stiffness portions including said enhanced stiffness portion, at least one of said plurality of enhanced stiffness portions is at least partially on one of the inner and outer surface of the sidewall, and another of said plurality of enhanced stiffness sidewall portions is at least partially on the other of the inner and outer surfaces of the sidewall.

4. The crucible of claim 3 wherein said at least one enhanced stiffness sidewall portion that is at least partially on one of the inner and outer surface of the sidewall and said another enhanced stiffness sidewall portion include parts of the inner and outer surfaces that are in registration with one another.

5. The crucible of claim 2 in combination with a susceptor for supporting the crucible in a high temperature environment, wherein the susceptor has splits and at least one enhanced stiffness sidewall portion is located adjacent to one of the splits.

6. The crucible of claim 2 in combination with a susceptor for supporting the crucible in a high temperature environment, wherein the susceptor has splits and wherein at least one enhanced stiffness sidewall portion is located adjacent to a midway point between the splits on the circumference of the body.

7. The crucible of claim 1 wherein said enhanced stiffness sidewall portion is located adjacent to the open top of the body.

8. A crucible holding melted semiconductor material, the crucible comprising: a body of vitreous silica having an open top, a bottom opposite the top and a sidewall extending up from the bottom to the top, the bottom and sidewall defining a cavity holding the melted semiconductor material, the melted semiconductor material having a level on the sidewall, the sidewall having an inner surface and an outer surface; and a devitrification promoter coating on at least a portion of one of the inner and outer surfaces of the sidewall; wherein a lower margin of the sidewall adjacent the bottom and beneath the level of the melted semiconductor material is substantially free of devitrification promoter coating on the inner surface and the outer surface to accommodate stress in the sidewall when heated.

9. The crucible of claim 8 wherein part of the devitrification promoter coating is on the inner surface of the sidewall and part of the devitrification promoter coating is on the outer surface of the sidewall.

10. The crucible of claim 9 wherein part of the devitrification promoter coating on the inner surface and part of the devitrification promoter coating on the outer surface are in registration with each other.

11. The crucible of claim 8 wherein: the cavity holds the semiconductor material in the crucible below a preselected maximum melt level for the crucible; and the body of the crucible is substantially free of enhanced stiffness sidewall portions below a plane that is at least 1 mm above the preselected maximum melt level for the crucible.

12. The crucible of claim 11 wherein the plane below which the body is substantially free of enhanced stiffness sidewall portions is at least 10 mm above the preselected maximum melt level for the crucible.

13. The crucible of claim 11 wherein the plane below which the body is substantially free of enhanced stiffness sidewall portions is at least 50 mm above the preselected maximum melt level for the crucible.

14. The crucible of claim 8 wherein at least a portion of the devitrification promoter coating occupies a band extending circumferentially around the body adjacent the top on the inner surface of the sidewall.

\* \* \* \* \*